US005893721A

United States Patent [19]
Huang et al.

[11] Patent Number: 5,893,721
[45] Date of Patent: Apr. 13, 1999

[54] METHOD OF MANUFACTURE OF ACTIVE MATRIX LED ARRAY

[75] Inventors: Rong-Ting Huang, Gilbert; Phil Wright, Scottsdale; Paige M. Holm, Phoenix, all of Ariz.

[73] Assignee: Motorola, Inc., Schaumburg, Ill.

[21] Appl. No.: 08/823,382

[22] Filed: Mar. 24, 1997

[51] Int. Cl.$^6$ .................................................. H01L 33/00
[52] U.S. Cl. ........................ 438/34; 438/23; 438/35
[58] Field of Search ...................... 438/23, 34, 35

[56] References Cited

U.S. PATENT DOCUMENTS

| | | | |
|---|---|---|---|
| 5,242,820 | 9/1993 | Kim | 438/34 |
| 5,250,931 | 10/1993 | Misawa et al. | 345/206 |
| 5,453,386 | 9/1995 | Holm et al. | 438/34 |
| 5,482,896 | 1/1996 | Tang | 438/28 |

*Primary Examiner*—Charles L. Bowers, Jr.
*Assistant Examiner*—Keith Christianson
*Attorney, Agent, or Firm*—Eugene A. Parsons

[57] ABSTRACT

A method of fabricating an active matrix LED array includes forming layers of material on a substrate, which layers cooperate to emit light when activated. Row and column dividers are formed in the layers to divide the layers into an array of LEDs arranged in rows and columns. One FET is formed on the row dividers in association with each LED and a source of each FET is connected to an anode of the associated LED. Row and column buses are formed on the row and column dividers, respectively, and the drain of each FET is connected to an adjacent row bus with the gate of each FET being connected to an adjacent column bus. A cathode for each LED is connected as a common terminal for all of the LEDs in the array.

17 Claims, 7 Drawing Sheets

METHOD OF MANUFACTURE OF ACTIVE MATRIX LED ARRAY

FIELD OF THE INVENTION

The present invention pertains to the manufacture of matrices of light emitting devices and more specifically to active matrices and methods of manufacture.

BACKGROUND OF THE INVENTION

Displays utilizing two dimensional arrays, or matrices, of pixels each containing one or more light emitting devices are very popular in the electronic field and especially in portable electronic and communication devices, because large amounts of data and pictures can be transmitted very rapidly and to virtually any location.

Light emitting device (LED) arrays are becoming more popular as an image source in both direct view and virtual image displays. One reason for this is the fact that LEDs are capable of generating relatively high amounts of light (high luminance), which means that displays incorporating LED arrays can be used in a greater variety of ambient conditions. For example, reflective LCDs can only be used in high ambient light conditions because they derive their light from the ambient light, i.e. the ambient light is reflected by the LCDs. Some transflective LCDs are designed to operate in a transmissive mode and incorporate a backlighting arrangement for use when ambient light is insufficient. In addition, transflective displays have a certain visual aspect and some users prefer a bright emissive display. However, these types of displays are generally too large for practical use in very small devices.

Also, organic light emitting diodes or organic electroluminescent devices and arrays thereof (hereinafter included as LEDs) are emerging as a potentially viable design choice for use in small products, especially small portable electronic devices, such as pagers, cellular and portable telephones, two-way radios, data banks, etc. Organic LED arrays are capable of generating sufficient light for use in displays under a variety of ambient light conditions (from little or no ambient light to bright ambient light). Further, organic LEDs can be fabricated relatively cheaply and in a variety of sizes from very small (less than a tenth millimeter in diameter) to relatively large (greater than an inch) so that organic LED arrays can be fabricated in a variety of sizes. Also, organic LEDs have the added advantage that their emissive operation provides a very wide viewing angle.

A major disadvantage in the use of LED arrays is the complexity of the manufacturing process. In passive arrays, for example, each LED requires two contacts, generally an anode and a cathode, connected to column and row buses. The arrays are generally manufactured by depositing materials on a supporting substrate and addressing/driver connections to row and column buses are made around the edges, which means that additional power (current for organic LEDs) is required for LEDs farther from the source. Another problem complicating the fabrication of LED arrays is the fact that the fill factor (the ratio of the emitting surface to the total surface) is limited by the data addressing metal lines. For example, in LED passive arrays, as the number of pixels in an array is increased to increase the resolution, the column metal line width increases to prevent electromigration effect. Thus, if the LED emitting area is fixed, the fill factor decreases as the array resolution increases, e.g. 1/8 Video Graphics Array (VGA) has a 25% fill factor, 1/4 VGA has a 16% fill factor, and VGA has an 8% fill factor. Further, the pixel pitch increases as the array resolution increases, e.g. 1/8 Video Graphics Array (VGA) has a 20 µm pitch, 1/4 VGA has a 25 µm pitch, and VGA has a 35 µm pitch. Also, the driving current increases as array resolution increases, e.g. 1/8 Video Graphics Array (VGA) has a driving current of 7.2 mA, 1/4 VGA has a driving current of 12 mA, and VGA has a driving current of 24 mA.

Accordingly, it would be beneficial to provide an LED array and driving apparatus which overcomes these problems.

It is a purpose of the present invention to provide a new and improved active LED array and driving apparatus.

It is also purpose of the present invention to provide a new and improved active LED array and driving apparatus which requires less manufacturing steps and is simpler to manufacture.

It is another purpose of the present invention to provide a new and improved active LED array and driving apparatus with reduced metal line widths and a reduction in addressing current It is another purpose of the present invention to provide a new and improved active LED array and driving apparatus with a reduced pitch and a higher fill factor.

It is still another purpose of the present invention to provide a new and improved active LED array and driving apparatus which is easier and less expensive to fabricate and use.

It is a further purpose of the present invention to provide a new and improved active LED array and driving apparatus in which the LED, active circuits and drivers are integrated onto a single substrate.

SUMMARY OF THE INVENTION

The above problems and others are at least partially solved and the above purposes and others are realized in a method of fabricating an active matrix LED array including forming layers of material on a substrate, which layers cooperate to emit light when activated. The layers may be, for example, epitaxially grown semiconductor layers or organic layers. Row and column dividers are formed in the layers to divide the layers into an array of LEDs arranged in rows and columns. One active control circuit is formed on the row dividers in association with each LED and a first power terminal of each active control circuit is connected to a first terminal of the associated LED. Row and column buses are formed on the row and column dividers, respectively, and a second power terminal of each active control circuit is connected to an adjacent row bus with a control terminal of each active control circuit being connected to an adjacent column bus. A second terminal for each LED is connected as a common terminal for all of the LEDs in the array.

In a specific example, an active matrix light emitting device array includes a semiconductor substrate having a surface and a plurality of layers of semiconductor material epitaxially grown on the surface of the substrate, the plurality of layers of semiconductor material cooperating to emit light when activated. Row and column isolating dividers formed in the plurality of layers of material by implanting ions so as to divide the plurality of layers of material into an array of LEDs arranged in rows and columns. A plurality of portions of recrystallized amorphous silicon are formed on the row dividers, one each adjacent each light emitting device and a source and drain are formed in each of the plurality of portions of recrystallized amorphous silicon to define a plurality of field effect transistors (FETs). A gate is formed on each of the plurality of portions of recrystallized amorphous silicon between the spaced apart power terminals with the control terminals cooperating to define a plurality of column buses connecting the control terminals into columns. The source of each of the FETs is connected to an anode of the associated LED. A plurality of row buses connect the drain of each of the plurality of FETs into rows and define row buses. A second terminal of each LED in the array is connected as a common terminal for all of the LEDs in the array.

BRIEF DESCRIPTION OF THE DRAWINGS

Referring to the drawings.

DESCRIPTION OF THE PREFERRED EMBODIMENTS

Figure 1:
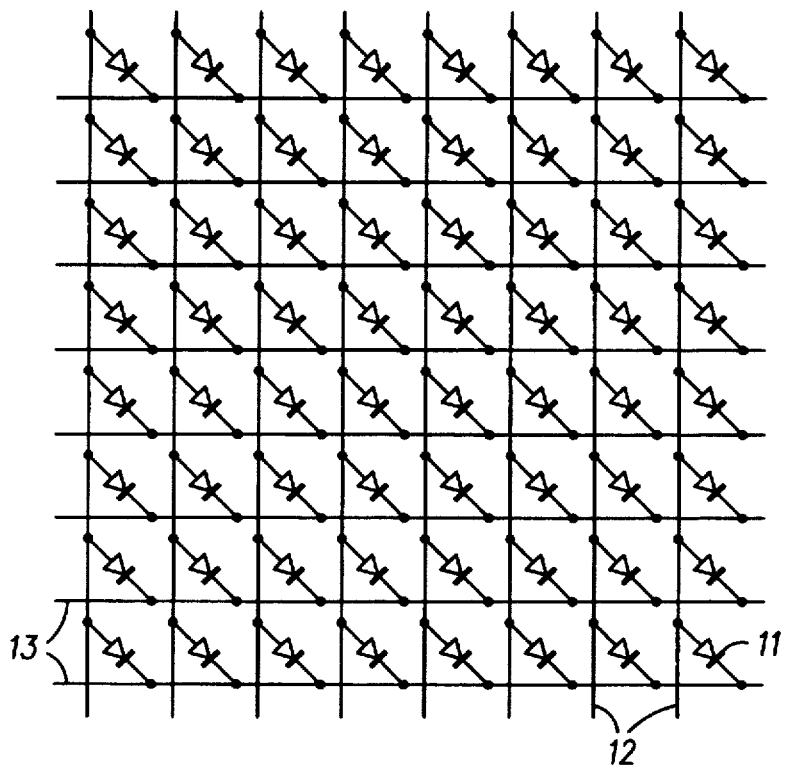
FIG. 1 is a simplified schematic diagram of a prior art passive LED matrix.
Figure 2:
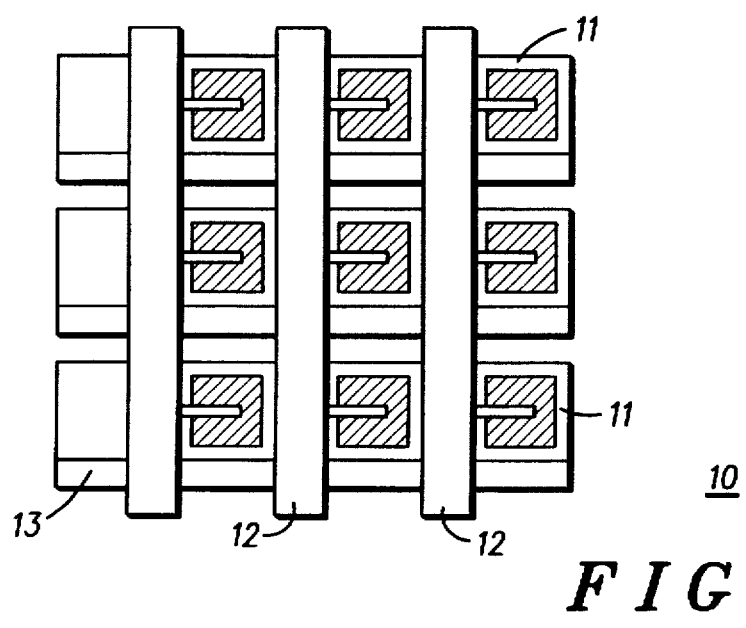
FIG. 2 is a simplified view in top plan of a portion of the passive matrix of FIG. 1.

Turning now to the drawings, FIGS. 1 and 2 illustrate a simplified schematic drawing and a simplified view in top plan, respectively, of a prior art passive LED matrix 10. Passive matrix 10 includes a plurality of LEDs 11 arranged in rows and columns with the anodes connected into columns by column buses 12 and the cathodes connected into rows by row buses 13. Because two terminals must be connected for each LED, the manufacturing process for passive array 10 includes many steps and is very complicated. Further, as can be seen by referring specifically to FIG. 2, the column buses must be relatively wide (at least 7 μm for an array with 1/8 VGA resolution) to carry the required amount of current which results in a pitch of 20 μm. Also, the row buses are relatively wide which, together with the wide column buses, substantially reduces the fill factor of the array.

Figure 3:
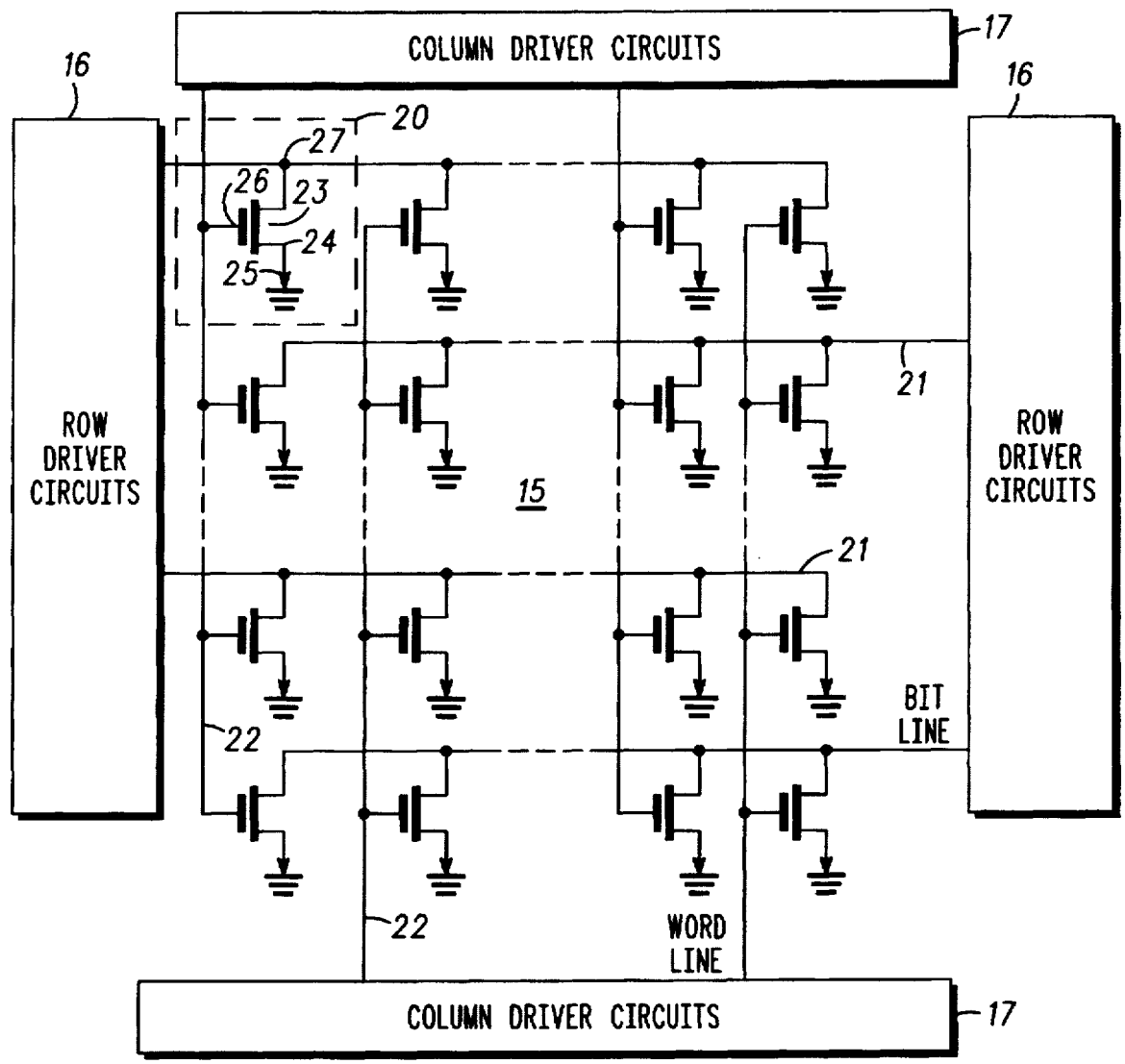
FIG. 3 is a simplified schematic diagram of an active LED matrix and driver circuits in accordance with the present invention.

Referring specifically to FIG. 3, a simplified schematic diagram is illustrated of an active matrix 15, row driver circuits 16 and column driver circuits 17 in accordance with the present invention. As will be seen presently, active matrix 15 and row and column driver circuits 16 and 17 are all formed on a single semiconductor substrate. Further, active matrix 15 is formed in an array area, which in this specific embodiment is positioned generally centrally, and row and column drivers 16 and 17 are positioned in driver areas, which in this specific embodiment are positioned around the perimeter of the array area. Also, row drivers 16 and column drivers 17 are each split into two groups positioned on opposite sides of the array area so that alternate row buses terminate on opposite sides of the array area to allow more area for each driver and, similarly, alternate column buses terminate on opposite sides of the array area.

Active matrix 15 includes a plurality of pixels 20 arranged in rows and columns with each row having an associated row bus 21 and each column having an associated column bus 22. Each pixel 20 of active matrix 15 includes a field effect transistor (FET) 23 and a light emitting device (LED) 25. A source 24 of FET 23 is connected to the anode of the associated (LED) 25, a gate 26 is connected to the associated column bus 22, and a drain 27 is connected to the associated row bus 21. The cathode of LED 25 is connected to a common potential, such as ground. It will of course be understood that LEDs 25 could be constructed with the cathode connected to a power terminal of FET 23 and the anode connected to the common potential, such as ground, if convenient.

While a single FET 23 is illustrated to represent an active control circuit it will be understood by those skilled in the art that additional components can be incorporated within the concepts of the present invention. Also, while n-type MOSFETs are incorporated as the active switch and CMOS drivers are used as row and column drivers in the preferred embodiment, it will be understood that other components and types can be substituted in accordance with the precepts of this invention.

Figure 4:
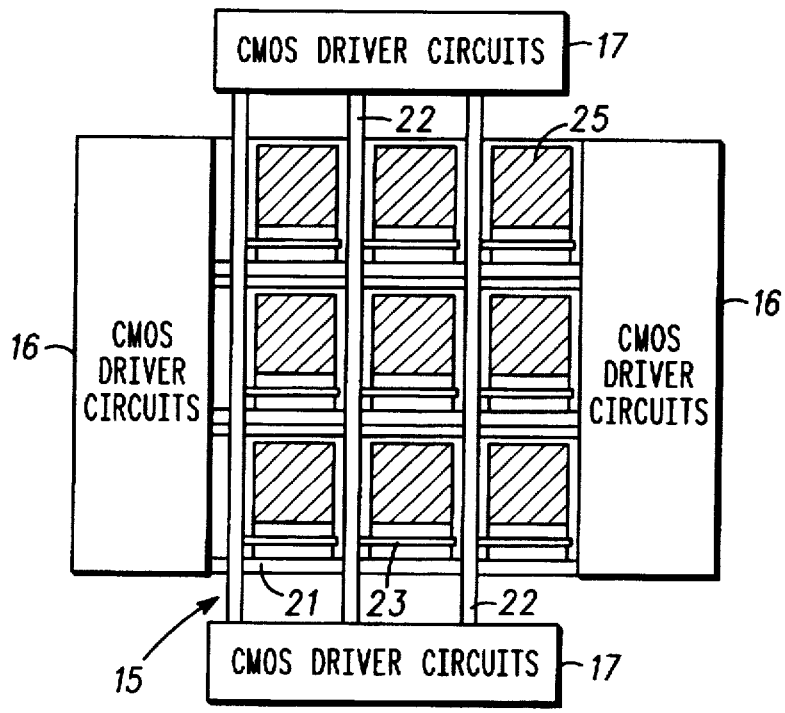
FIG. 4 is a simplified view in top plan of the active LED matrix of FIG. 3.

Turning now to FIG. 4, a simplified view in top plan of active LED matrix 15 of FIG. 3 is illustrated along with row driver circuits 16 and column driver circuits 17. A FET 23 is positioned beside each associated LED 25 extending generally parallel to and in contact with an associated row bus 21. By extending FETs 23 as illustrated, with the gate 26 extending the width of the associated LED 25, the FET can carry more current while being constructed smaller. Gates 26 are described herein as being connected to columns 22 and drains 27 are described as being connected to rows 21 but it will be understood by those skilled in the art that the terms "rows" and "columns" are completely interchangeable and are not intended to limit the active matrix to a specific orientation.

Figure 5:
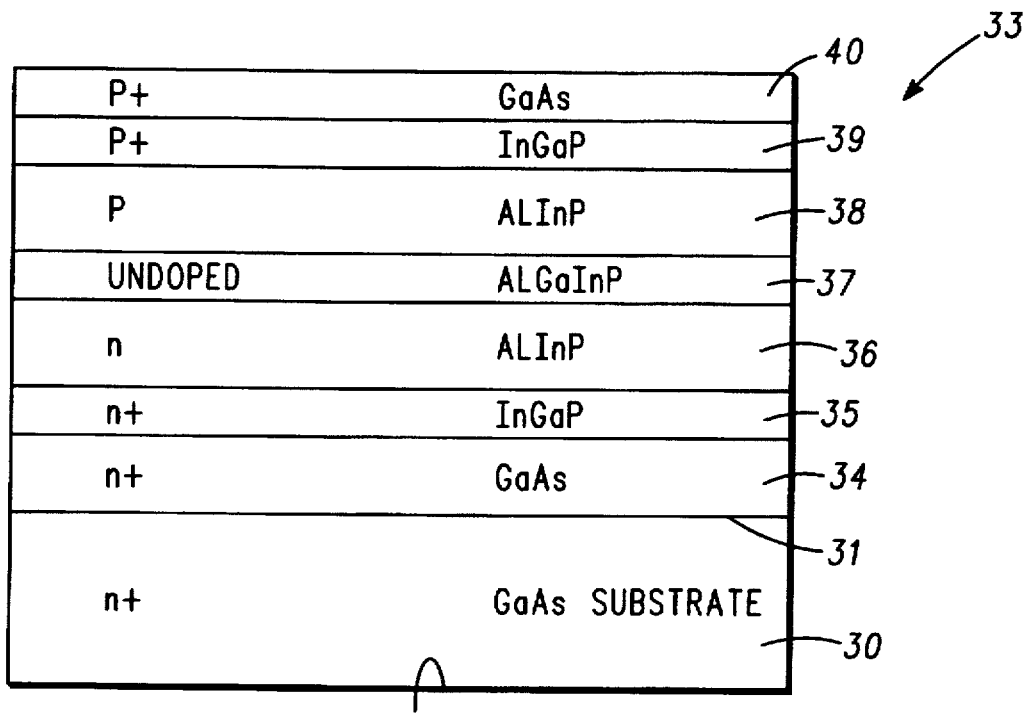
FIGS. 5–12 are simplified cross-sectional views illustrating various intermediate steps in the fabrication of the active LED matrix shown in FIG. 4.
Figure 13:
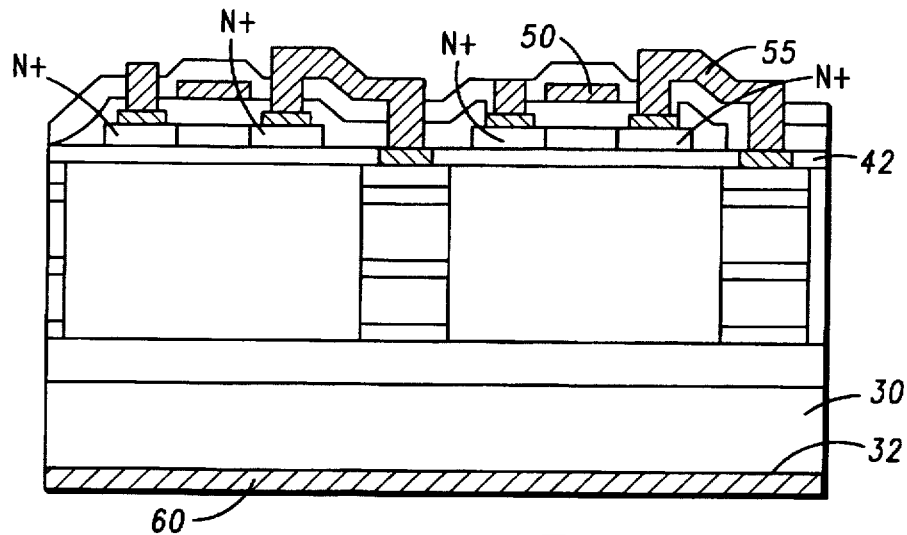
FIG. 13 is a simplified cross-sectional view of the completed active matrix of FIG. 4 generally as seen along the line 13—13 of FIG. 4.

Turning now to FIGS. 5–12, simplified cross-sectional views illustrating various intermediate steps in the fabrication of the active LED matrix shown in FIG. 4 are illustrated. It should be noted that the structures illustrated in FIGS. 5–12 are intermediate steps and cannot be seen accurately in any completed structure, however, as will be explained presently a cross-section of the completed structure is illustrated in FIG. 13, as is seen generally from the line 13—13 in FIG. 4. Also, the dimensions in the drawings are not accurate but are extended somewhat in some portions to allow the illustration of the various components in their relative positions for a complete understanding of the invention. Referring specifically to FIG. 5, a substrate 30 is illustrated, which in this specific embodiment is formed of gallium arsenide (GaAs) relatively heavily doped for n+ conduction. Substrate 30 has an upper surface 31 and a lower surface 32. A plurality of layers 33 of material are positioned on upper surface 31 of substrate 30, with plurality of layers 33 cooperating to emit light when activated. It should be understood that plurality of layers 33 can include semiconductor material to form a semiconductor light emitting diode or organic material to form an organic electroluminescent device. In this specific embodiment plurality of layers 33 are epitaxially grown semiconductor layers.

A first layer 34 is epitaxially grown semiconductor material (n+ GaAs) which acts as a buffer layer to crystalographically match the following layers to substrate 30. A second layer 35 is included to provide a match between the GaAs material system and the material system of the LEDs. Layer 35 includes n+ doped InGaP. Layers 34 and 35 are heavily doped to provide lower electrical contact layers for array 15, as will be apparent presently. A third layer 36 is formed of lightly n doped AlInP and forms the cathode terminal for the LEDs. A fourth layer 37 is an active or light emitting layer of the LEDs and in this embodiment is undoped AlGaInP. Anode terminals for the LEDs are formed by a lightly p doped layer 38 of AlInP grown on fourth layer 37 with a material system matching layer 39 of heavily p+ doped InGaP grown thereon and an upper contact layer 40 of heavily p+ doped GaAs completing the plurality of layers 33.

Figure 6:
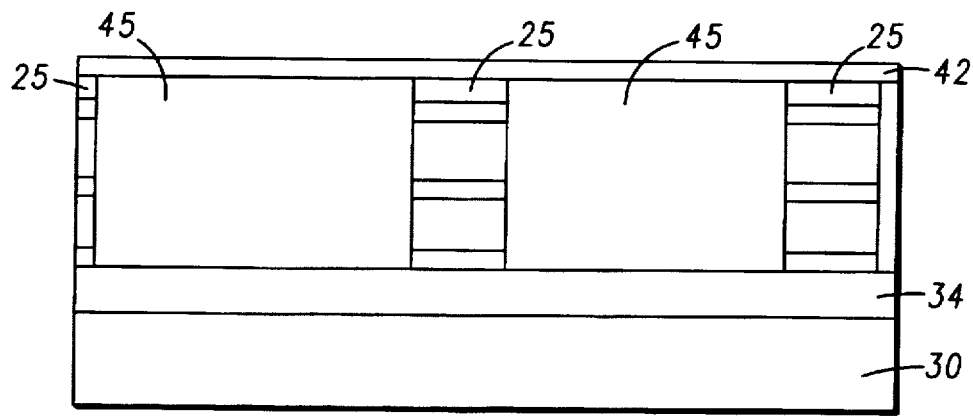

Referring specifically to FIG. 6, a dielectric layer 42, which may be, for example, silicon nitride ($Si_3N_4$), silicon dioxide ($SiO_2$), etc. is deposited on the upper surface of contact layer 40 to insulate contact layer 40 from the following structure. Row and column dividers are formed in plurality of layers 33 so as to divide plurality of layers 33 into an array of light emitting devices arranged in rows and columns, e.g. array 15 of LEDs 25 of FIG. 4. In this preferred embodiment, the row and column dividers 45 are formed by implants. The implants generally include some inactive material, such as oxygen ions (O+), hydrogen ions (H+), or the like, implanted in a well known manner at energies sufficiently high to carry the implants deep enough to isolate adjacent LEDs 25 (at least through active layer 37) by forming a high resistance volume surrounding each LED 25. It should be understood that FIGS. 5–12 are not drawn to scale and various portions are exaggerated in size for a complete understanding of the process and structure.

Figure 7:
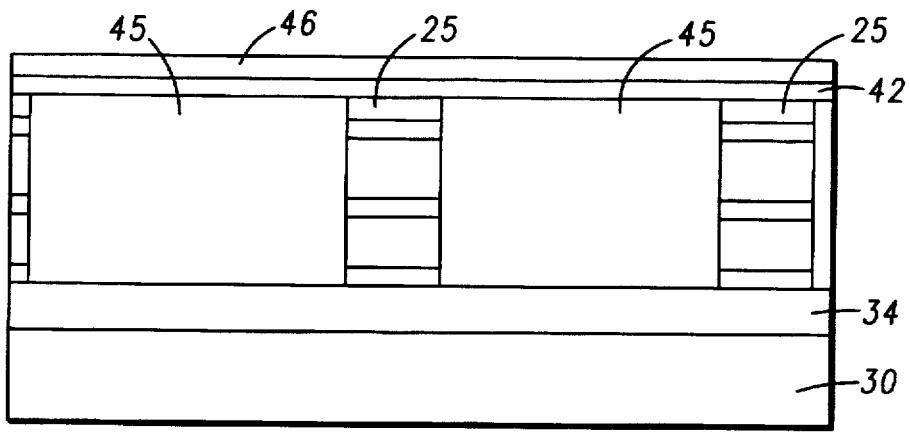
Figure 8:
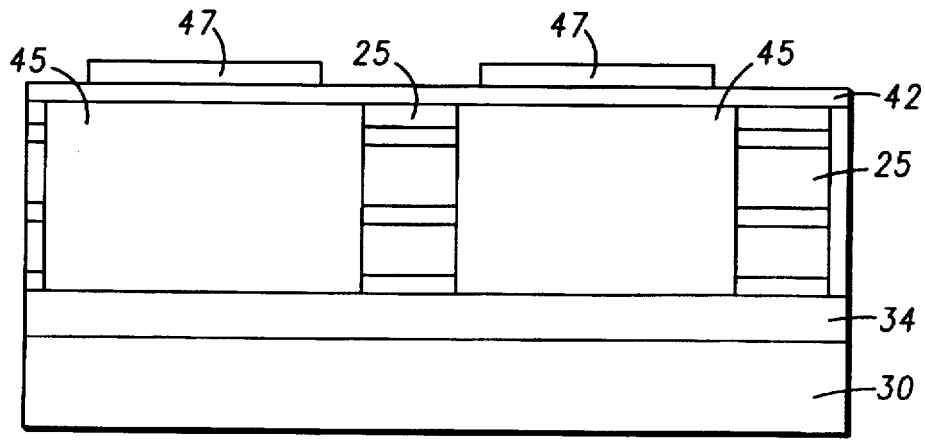

With row and column dividers 45 in place and defining rows and columns of LEDs 25, a plurality of portions of recrystallized amorphous silicon are patterned on row dividers 45, one each adjacent each LED 25, generally as follows. A layer 46 of amorphous silicon is formed on the surface of dielectric layer 42, as illustrated in FIG. 7. Layer 46 of amorphous silicon is recrystallized utilizing any of the well known processes, including laser recrystallization (e.g. using an excimer laser), thermal recrystallization, etc. The recrystallized amorphous silicon is then masked and etched, using any convenient procedure (e.g. dry or wet etch) to form portions 47 of recrystallized amorphous silicon on row dividers 45 adjacent each LED 25, as illustrated in FIG. 8.

Figure 9:
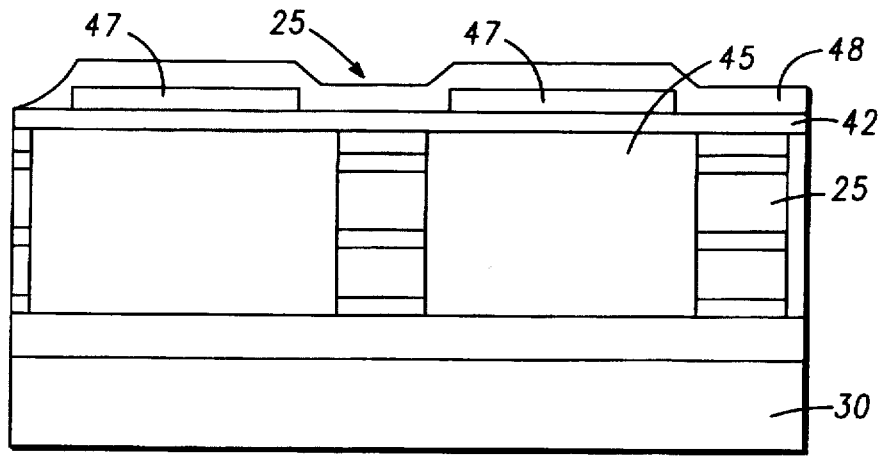

A plurality of active control circuits, one each are formed in each of the portions 47. While each of the active control circuits can include one or more components, such as transistors, electronic switches, etc., in this specific embodiment a field effect transistor (FET) is incorporated in series with each LED 25 as a switch. The portions 47 of recrystallized amorphous silicon are used as a substrate in which to form the electronic switches, as described below. A thin layer 48 of gate dielectric, which in this preferred embodiment is a thermal or PECVD deposited oxide, is formed in a blanket over the entire array area, as illustrated in FIG. 9.

Figure 10:
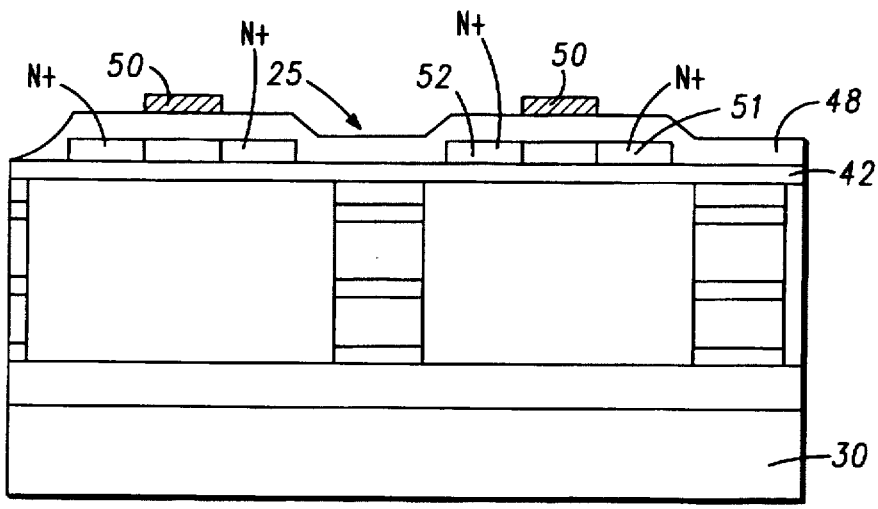

Gates 50 are deposited and patterned on layer 48 of dielectric material, approximately centrally over portion 47 of recrystallized amorphous silicon, as illustrated in FIG. 10. Gates 50 are formed of some convenient gate material, such as polysilicon, TiW, Al, etc. Gates 50 are then used as a self-aligned mask to implant power terminals, such as a source 51 and a drain 52, adjacent each gate 50 in each portion 47 of recrystallized amorphous silicon. In this embodiment, the source and drain terminals 51 and 52 are implants which, when properly activated, produce n+ doped areas that operate as spaced apart power terminals in a fashion that is well understood in the semiconductor art.

Figure 11:
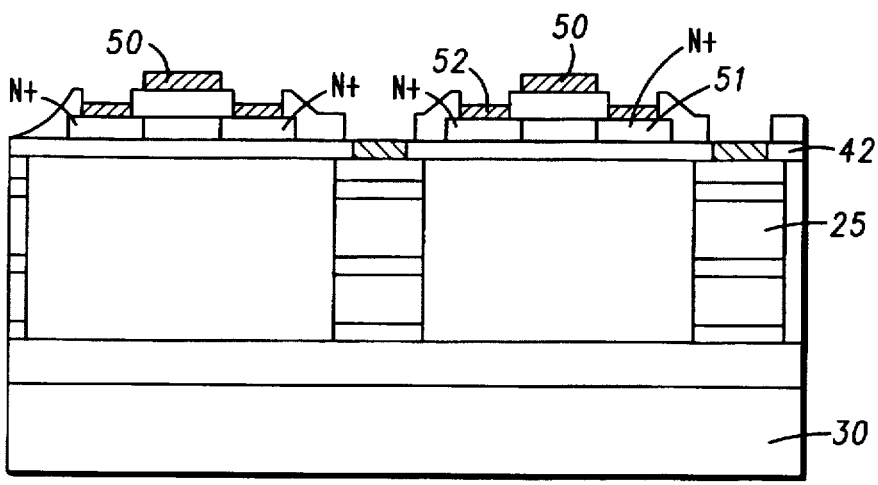
Figure 12:
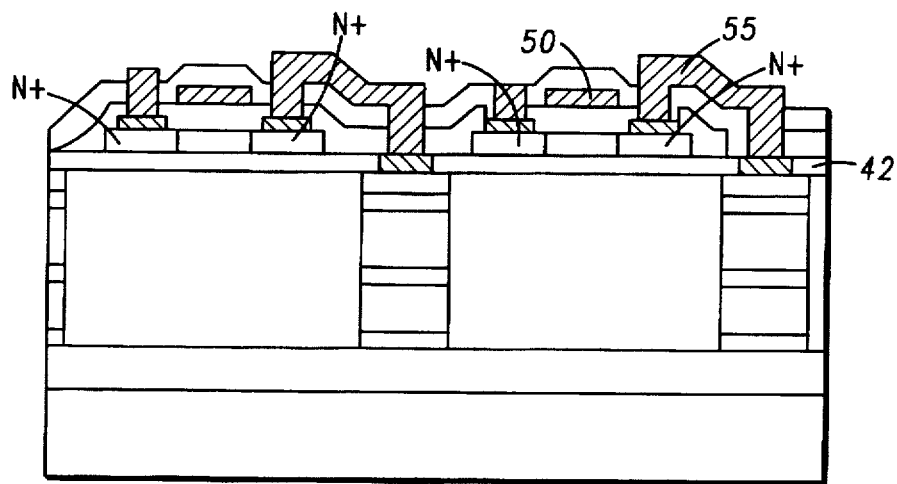

Openings are etched through layer 48 of dielectric material, and dielectric layer 42 over LEDs 25, to open contact areas with each source 51, drain 52, and LED 25 and ohmic metal is deposited in the openings to form external contacts therewith, as illustrated in FIG. 11. A dielectric layer, such as $Si_3N_4$, is deposited in a blanket layer over the entire array 15 and openings are again etched to provide contacts to each gate 50, source 51, drain 52, and LED 25. A first metallization is then performed to connect the ohmic metal of each source to the ohmic metal of each adjacent or associated LED 25, as indicted by metallization 55 of FIG. 12. Also, the first metallization connects all of the gates 50 in each column into column buses, which are also connected to column drivers 17. Further, the first metallization connects the ohmic metal of each drain in each row into row buses, which are also connected to row drivers 16.

Finally, a layer 60 of n-ohmic metal is deposited on rear surface 32 of substrate 30 to form a common terminal for each LED 25 in array 15, as illustrated in FIG. 13. The specific LED illustrated and described, with the InGaAlP/GaAs material system, emits red or green light when properly energized.

Figure 14:
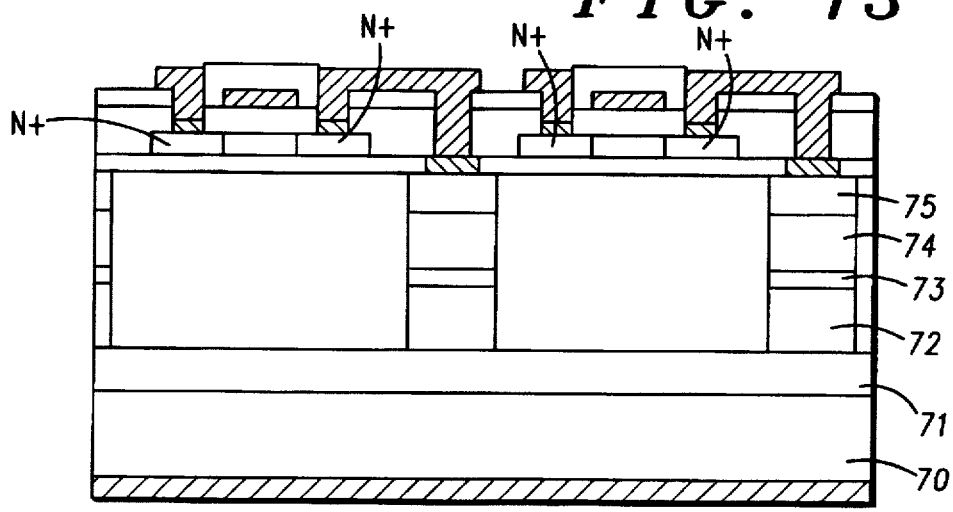
FIG. 14 is a simplified cross-sectional view similar to FIG. 13 of another embodiment.

Turning now to FIG. 14, a simplified cross-sectional view similar to FIG. 13 of another embodiment of an active LED matrix such as that shown in FIG. 4 is illustrated. This specific embodiment includes a substrate 70 formed of n doped silicon carbide (SiC) and includes a first layer 71 of n+ doped GaN formed thereon as a lower contact layer. A layer 72 of n doped AlGaN is formed on layer 71 as a lower or first terminal of the LEDs, an active layer 73 of undoped InGaN is formed on layer 72, a layer 74 of p doped AlGaN is formed over active layer 73 as an upper or second terminal of the LEDs and a heavily p+ doped layer 75 of GaN is formed over layer 74 as an upper contact layer. The remainder of the process steps are substantially as described above to form the plurality of layers into an array of LEDs arranged in rows and columns with each LED having an associated active circuit connected thereto. The specific LED illustrated and described with reference to FIG. 14, with the GaN material system, emits blue or green light when properly energized.

Figure 15:
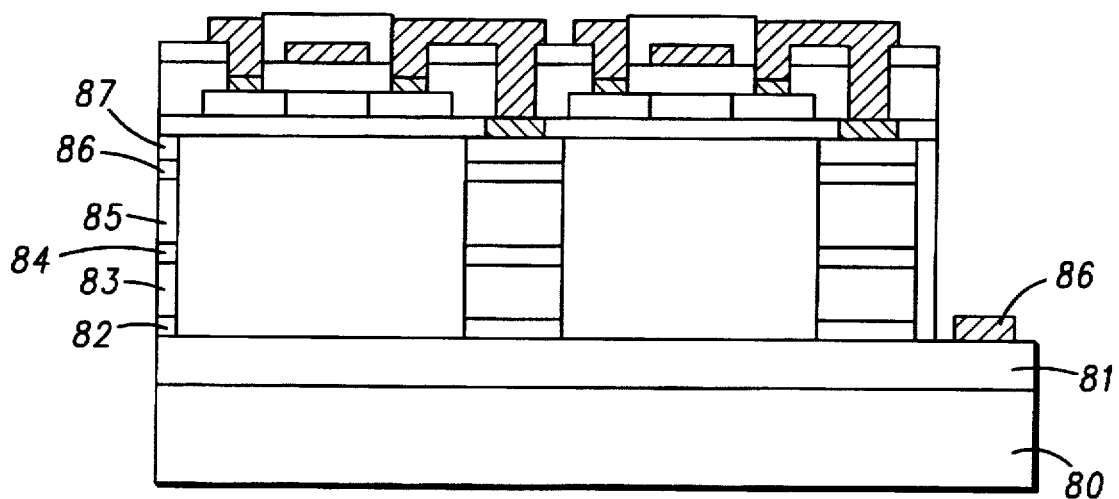
FIG. 15 is a simplified cross-sectional view similar to FIG. 13 of another embodiment.

Turning now to FIG. 15, a simplified cross-sectional view similar to FIG. 13 of another embodiment of an active LED matrix such as that shown in FIG. 4 is illustrated. This specific embodiment includes a substrate 80 formed of semi-insulating GaAs and includes a first contact layer 81 of heavily n+ doped GaAs formed thereon as a common contact layer for all of the LEDs in the array. A layer 82 of n+ doped InGaP is formed on layer 81 as a buffer layer, a layer 83 of n doped AlInP is formed on layer 82 as a lower or first terminal of the LEDs, an active layer 84 of undoped AlGaInP is formed on layer 83, a layer 85 of p doped AlInP is formed over active layer 84 as an upper or second terminal of the LEDS, a layer 86 of p+ doped InGaP is formed over layer 85 as a crystal matching layer, and a heavily p+ doped layer 87 of GaAs is formed over layer 86 as an upper contact layer. The remainder of the process steps are substantially as described above to form the plurality of layers into an array of LEDs arranged in rows and columns with each LED having an associated active circuit connected thereto. In this specific embodiment a common electrical terminal 88 for the LED array is positioned on an exposed upper surface of contact layer 81. The specific LED illustrated and described with reference to FIG. 15, with the aluminum indium phosphide (AlInP) material system, emits red or green light when properly energized.

Figure 16:
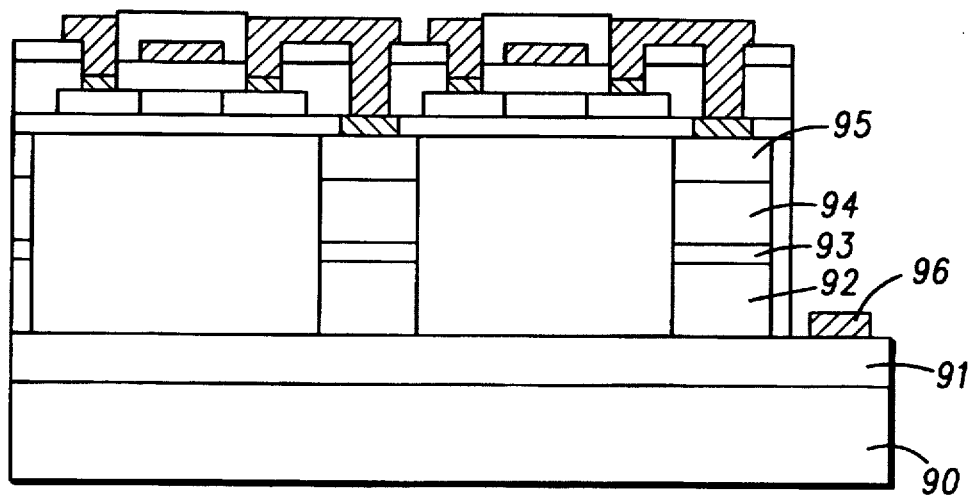
FIG. 16 is a simplified cross-sectional view similar to FIG. 13 of another embodiment.

Turning now to FIG. 16, a simplified cross-sectional view similar to FIG. 13 of another embodiment of an active LED matrix such as that shown in FIG. 4 is illustrated. This specific embodiment includes a substrate 90 formed of sapphire and includes a first layer 91 of n+ doped GaN formed thereon as a lower contact layer. A layer 92 of n doped AlGaN is formed on layer 91 as a lower or first terminal of the LEDs, an active layer 93 of undoped InGaN is formed on layer 91, a layer 94 of p doped AlGaN is formed over active layer 93 as an upper or second terminal of the LEDs and a heavily p+ doped layer 95 of GaN is formed over layer 94 as an upper contact layer. The remainder of the process steps are substantially as described above to form the plurality of layers into an array of LEDs arranged in rows and columns with each LED having an associated active circuit connected thereto. In this specific embodiment a common electrical terminal 96 for the LED array is positioned on an exposed upper surface of contact layer 91. The specific LED illustrated and described with reference to FIG. 16, with the gallium nitride material system, emits blue or green light when properly energized.

Thus, it can be seen that the fill factor of the active LED array is greatly improved because the active circuits are formed on the row dividers. Also, by incorporating an active circuit with each LED in the array, the size of the column and row buses is greatly reduced and less driving power is required. Further, by incorporating an active circuit with each LED in the array a common terminal can be used for each LED, which greatly reduces the complexity of the structure and the manufacturing process.

Thus, a new and improved active LED array and driving apparatus have been disclosed with a high fill factor which is easier and less expensive to fabricate and use. Further, the new and improved active LED array and driving apparatus includes an array of LEDs, active circuits and drivers integrated onto a single substrate.

While we have shown and described specific embodiments of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

What is claimed is:

1. A method of fabricating an active matrix light emitting device array comprising the steps of:

providing a semiconductor substrate having a surface;

forming a plurality of layers of material on the surface of the substrate, the plurality of layers of material cooperating to emit light when activated;

forming row and column dividers in the plurality of layers of material so as to divide the plurality of layers of material into an array of light emitting devices arranged in rows and columns;

forming a plurality of active control circuits on the row dividers one each associated with each light emitting device in the array, each active control circuit including first and second power terminals and a control terminal with the first power terminal of each active control circuit connected to a first terminal of the associated light emitting device, the step including patterning a plurality of portions of recrystallized amorphous silicon on the row dividers, one each adjacent each light emitting device, forming a control terminal on each of the plurality of portions of recrystallized amorphous silicon; and implanting first and second spaced apart power terminals in each of the plurality of portions of recrystallized amorphous silicon, using the control terminals as a self-aligned mask;

forming row and column buses on the row and column dividers, respectively, and coupling the second power terminal in each active control circuit to an adjacent row bus and the control terminal in each active control circuit to an adjacent column bus; and forming a second terminal for each light emitting device in the array as a common terminal for all of the light emitting devices in the array.

2. A method of fabricating an active matrix light emitting device array as claimed in claim 1 wherein the step of providing the semiconductor substrate includes providing a substrate of one of GaAs, SiC, semi-insulating GaAs, and Sapphire.

3. A method of fabricating an active matrix light emitting device array as claimed in claim 1 wherein the step of forming the plurality of layers of material includes epitaxially growing layers of semiconductor material on the surface.

4. A method of fabricating an active matrix light emitting device array as claimed in claim 1 wherein the step of forming the plurality of layers of material includes depositing layers of organic material.

5. A method of fabricating an active matrix light emitting device array as claimed in claim 3 wherein the step of forming row and column dividers in the plurality of layers includes implanting material to increase the resistance and isolate the light emitting devices from each other.

6. A method of fabricating an active matrix light emitting device array as claimed in claim 5 wherein the step of implanting material to increase the resistance and isolate the light emitting devices includes implanting one of oxygen and hydrogen ions in semiconductor layers of material.

7. A method of fabricating an active matrix light emitting device array as claimed in claim 1 wherein the step of forming the control terminals includes forming the column buses.

8. A method of fabricating an active matrix light emitting device array as claimed in claim 1 wherein the step of forming the control terminal on each of the plurality of portions of recrystallized amorphous silicon includes depositing a layer of gate dielectric on each of the plurality of portions of recrystallized amorphous silicon and depositing gate material on each of the layers of gate dielectric between the spaced apart power terminals.

9. A method of fabricating an active matrix light emitting device array as claimed in claim 1 wherein the step of forming the second terminal for each light emitting device includes forming an ohmic metal contact on a reverse side of the substrate.

10. A method of fabricating an active matrix light emitting device array comprising the steps of:

providing a semiconductor substrate having a surface;

epitaxially growing a plurality of layers of semiconductor material on the surface of the substrate, the plurality of layers of semiconductor material cooperating to emit light when activated;

implanting row and column isolating dividers in the plurality of layers of material so as to divide the plurality of layers of material into an array of light emitting devices arranged in rows and columns;

patterning a plurality of portions of recrystallized amorphous silicon on the row dividers, one each adjacent each light emitting device;

forming a control terminal on each of the plurality of portions of recrystallized amorphous silicon and forming a plurality of row buses connecting the control terminals into rows;

implanting first and second spaced apart power terminals in each of the plurality of portions of recrystallized amorphous silicon, using the control terminals as a self-aligned mask to define a plurality of field effect transistors;

connecting a first power terminal of each of the field effect transistors to a first terminal of the associated light emitting device;

forming a plurality of column buses connecting the second power terminal of each of the plurality of field effect transistors into columns; and forming a second terminal for each light emitting device in the array as a common terminal for all of the light emitting devices in the array.

11. A method of fabricating an active matrix light emitting device array as claimed in claim 10 wherein the step of implanting row and column isolating dividers includes implanting one of oxygen and hydrogen ions in the plurality of layers of semiconductor material.

12. A method of fabricating an active matrix light emitting device array as claimed in claim 10 wherein the step of forming the control terminal on each of the plurality of portions of recrystallized amorphous silicon includes depositing a layer of gate dielectric on each of the plurality of portions of recrystallized amorphous silicon and depositing gate material on each of the layers of gate dielectric between the spaced apart power terminals.

13. A method of fabricating an active matrix light emitting device array as claimed in claim 10 wherein the step of forming the second terminal for each light emitting device includes forming an ohmic metal contact on a reverse side of the substrate.

14. A method of fabricating a plurality of layers of semiconductor devices and circuits on a substrate comprising the steps of:

providing a substrate having a surface;

positioning a plurality of layers of material on the surface of the substrate and forming semiconductor devices in the layers of material; and forming a plurality of circuits on the layers of material including the steps of patterning recrystallized amorphous silicon on the plurality of layers of material, forming terminals in the recrystallized amorphous silicon in communication with the semiconductor devices, and forming the plurality of circuits in communication with the terminals in the recrystallized amorphous silicon.

15. A method of fabricating a plurality of layers of semiconductor devices and circuits on a substrate as claimed in claim 14 wherein the step of providing the substrate includes providing a semiconductor substrate.

16. A method of fabricating a plurality of layers of semiconductor devices and circuits on a substrate as claimed in claim 15 wherein the step of providing the semiconductor substrate includes providing a substrate of one of GaAs, SiC, semi-insulating GaAs, and Sapphire.

17. A method of fabricating a plurality of layers of semiconductor devices and circuits on a substrate as claimed in claim 15 wherein the step of positioning the plurality of layers of material includes epitaxially growing layers of semiconductor material on the surface.

* * * * *